(12) United States Patent
Sherman et al.

(10) Patent No.: US 6,518,844 B1
(45) Date of Patent: Feb. 11, 2003

(54) SUSPENDED TRANSMISSION LINE WITH EMBEDDED AMPLIFIER

(75) Inventors: James R. Sherman, Seminole, FL (US); Ofira M. Von Stein, Madeira Beach, FL (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/548,467

(22) Filed: Apr. 13, 2000

(51) Int. Cl.[7] .............................. H03F 3/60; H03F 1/00; H01P 3/08

(52) U.S. Cl. ..................... 330/286; 330/53; 330/65; 333/238; 333/246

(58) Field of Search ................... 330/53, 54, 65–68, 330/286; 333/238, 246

(56) References Cited

U.S. PATENT DOCUMENTS

| | | | |
|---|---|---|---|
| 3,320,556 A | 5/1967 | Schneider | 333/34 |
| 3,419,813 A | 12/1968 | Kamnitsis | 330/30 |
| 4,214,217 A | 7/1980 | Saito et al. | 334/45 |
| 4,254,386 A | 3/1981 | Nemit et al. | 333/128 |
| 4,310,814 A | 1/1982 | Bowman | 333/121 |
| 4,394,633 A * | 7/1983 | Klein | 333/238 |
| 4,614,922 A | 9/1986 | Bauman et al. | 333/161 |
| 4,647,880 A | 3/1987 | Argaman | 333/164 |
| 4,772,864 A | 9/1988 | Otto et al. | 333/238 |
| 4,916,457 A | 4/1990 | Foy et al. | 343/770 |
| 4,945,319 A | 7/1990 | Wilson | 333/33 |
| 4,958,165 A | 9/1990 | Axford et al. | 343/770 |
| 4,987,377 A * | 1/1991 | Gray et al. | 330/54 |
| 5,021,755 A | 6/1991 | Gustafson | 333/128 |
| 5,030,935 A * | 7/1991 | Williams et al. | 333/246 |
| 5,187,490 A | 2/1993 | Ohta et al. | 343/770 |
| 5,200,719 A | 4/1993 | Margulis et al. | 333/34 |
| 5,293,175 A | 3/1994 | Hemmie et al. | 343/795 |
| 5,444,453 A | 8/1995 | Lalezari | 343/700 MS |
| 5,471,181 A | 11/1995 | Park | 333/246 |
| 5,581,266 A | 12/1996 | Peng et al. | 343/770 |
| 5,712,607 A * | 1/1998 | Dittmer et al. | 333/238 |
| 5,760,744 A | 6/1998 | Sauer | 343/700 MS |
| 5,767,808 A | 6/1998 | Robbins et al. | 349/700 |

(List continued on next page.)

FOREIGN PATENT DOCUMENTS

| | | | |
|---|---|---|---|
| EP | 0 317 414 A1 | 5/1989 | H01Q/21/24 |
| EP | 0 508 662 A2 | 10/1992 | H01P/5/12 |
| EP | 0 801 433 A1 | 10/1997 | H01P/3/08 |
| JP | S63-281502 | 11/1988 | H01P/6/08 |
| JP | 63281502 | 11/1988 | H01P/5/08 |

OTHER PUBLICATIONS

International Search Report dated Aug. 6, 2001, for PCT/US 01/11202 filed Apr. 6, 2001.
Peter, R., et al, "High–Performance HEMT Amplifiers with a Simple Low–Loss Matching Network," IEEE Transactions on Microwave Theory and Techniques, vol. 39, Sep. 1, 1991, No. 9, New York, US, pp. 1673–1675.
PCT International Search Report Dated Aug. 8, 2001 for PCT/US01/11277 Filed Apr. 6, 2001.

(List continued on next page.)

Primary Examiner—Patricia T. Nguyen
(74) Attorney, Agent, or Firm—Baker Botts L.L.P.

(57) ABSTRACT

A suspended transmission line with an embedded amplifier includes a support layer and a conductor supported on the support layer between first and second plates each having a ground plane. The conductor includes an input section and an output section. A propagation structure is disposed between the first and second plates to substantially encompass an electric field generated by a signal transmitted on the conductor. An amplifier is coupled to the input and output sections of the conductor and is at least substantially disposed between the first and second plates. The amplifier operates to amplify an input signal received on the input section to generate an output signal on the output section.

28 Claims, 7 Drawing Sheets

U.S. PATENT DOCUMENTS

| | | | |
|---|---|---|---|
| 5,789,997 A | 8/1998 | Dekker | 333/127 |
| 5,872,545 A | 2/1999 | Rammos | 343/770 |
| 5,914,695 A | 6/1999 | Liu et al. | 343/795 |
| 5,946,794 A | 9/1999 | Koizumi et al. | 29/600 |
| 6,081,988 A | 7/2000 | Pluymers et al. | 29/601 |
| 2002/0044098 A1 | 4/2002 | Von Stein et al. | 343/770 |

OTHER PUBLICATIONS

Mosko, United States Statutory Invention Registration H27, "Integrable Broadside Power Divider," filed Sep. 3, 1985, published Feb. 4, 1986.

M. Saito, et al, XP–002172854, "UHF TV Tuner Using PC Board with Suspended Striplines," IEEE Transactions on Consumer Electronics, vol. CE–24, No. 4, Nov. 1978, pp. 553–559.

PCT International Search Report dated Aug. 6, 2001 for PCT/US01/11410 filed Apr. 6, 2001.

PCT US01/11410 to Raytheon Company, publication date Oct. 25, 2001.

Pozar, D.M., *Microwave Engineering*, John Wiley & Sons, Inc., Second Edition, pp. 363–368, 1998.

Wilkinson, E.J., "An N–Way Hybrid Power Divider," IRE Transactions on Microwave Theory and Techniques, vol. MTT–8, No. 1, pp. 116–118, Jan., 1960.

Saleh, A.A.M., "Planar Electrically Symmetric n–Way Hybrid Power Dividers/Combiners," IEEE Transactions on Microwave Theory and Techniques, vol. MTT–28, No. 6, pp. 555–563, Jun., 1980.

Green, H.E., "The Numerical Solution of Some Important Transmission–Line Problems," IEEE Transactions on Microwave Theory and Technqiues, vol. MTT–13, No. 5, pp. 676–692, Sep., 1965.

Fromm, W.E., "Characteristics and Some Applications of Stripline Components," IEEE Transactions on Microwave Theory and Techniques, vol. MTT–3, No. 2, pp. 13–19, Mar., 1955.

Saleh, A.A.M., Computation of the Frequency Response of a Class of Symmetric N–Way Power Dividers, Bell System Technical Journal, vol. 59, No. 8, pp. 1493–1512, Oct., 1980.

\* cited by examiner

SUSPENDED TRANSMISSION LINE WITH EMBEDDED AMPLIFIER

RELATED APPLICATIONS

This application is related to U.S. patent application Ser. No. 09/548,691 entitled "Suspended Transmission Line and Method", U.S. patent application Ser. No. 09/548,686 entitled "Suspended Transmission Line with Embedded Signal Channeling Device", U.S. patent application Ser. No. 09/548,578 entitled "Integrated Broadside Conductor for Suspended Transmission Line and Method", and U.S. application Ser. No. 09/548,689 entitled "Method for Fabricating Suspended Transmission Line", all filed on Apr. 13, 2000.

TECHNICAL FIELD OF THE INVENTION

This invention relates generally to the field of signal transmission systems, and more particularly to a suspended transmission line with an embedded amplifier.

BACKGROUND OF THE INVENTION

Microwave and radio frequency circuits are generally implemented by interconnecting amplifiers, antennas, transmitters, receivers, and other components by a series of transmission lines. The transmission lines propagate microwave and radio frequency energy between the components of the circuit.

Transmission lines are generally implemented as waveguide pipes, striplines, and/or coaxial cables. Waveguide pipes are often impractical, however, because of the difficulty of installation and the size and weight is excessive for many applications. Striplines and coaxial cables are more compact and easier to install, but use special materials and fabrication processes that lead to high transmission line cost.

Further adding to the expense of microwave and radio frequency circuits is the expense of implementing amplifiers, antennas, and other components within the circuit. Typically, each component is implemented in a specially fabricated mechanical housing such as an aluminum box having signal, digital, and power connectors. These mechanical housings must generally be designed, engineered, and machined with tight tolerances for microwave and other high frequency applications. In addition, drawing packages need to be generated and maintained for each housing. Connectors must also be thermally matched to the mechanical housing.

SUMMARY OF THE INVENTION

The present invention provides a transmission line amplifier that substantially eliminates or reduces the problems and disadvantages associated with prior methods and systems. In particular, the amplifier is embedded into a suspended transmission line for use in microwave and radio frequency applications.

In accordance with one embodiment of the present invention, a suspended transmission line with an embedded amplifier includes a support layer and a conductor supported on the support layer between first and second plates each having a ground plane. The conductor includes an input section and an output section. A propagation structure is positioned between the first and second plates to substantially contain an electric field generated by a signal transmitted on the conductor. An amplifier is coupled to the input and output sections of the conductor and is at least substantially disposed between the first and second plates. The amplifier operates to amplify an input signal received on the input section to generate an output signal on the output section.

Technical advantages of the present invention include providing a low cost and space efficient transmission system. In particular, amplifiers and other elements are embedded into the transmission line substantially without degradation in line performance. The amplifiers may be low noise and power amplifiers. Other embedded elements may be high power broadband combiners, filters, diplexers, and other passive elements as well as mixers, multipliers, switches, and other active elements. As a result, the transmission line structure is self-contained and includes fewer parts. The cost of designing, engineering, constructing, and maintaining separate mechanical housings for each element is minimized.

Another technical advantage of the present invention includes providing an improved power amplifier structure for microwave and radio frequency applications. In particular, the power amplifier is embedded within and integral with a suspended transmission line. As a result, separate substrates and carriers for the amplifier are eliminated. Separate transmission line connectors for the amplifier are also eliminated. Thus, the power amplifier may be constructed at relatively low cost.

Other technical advantages of the present invention will be readily apparent to one skilled in the art from the following figures, description, and claims.

BRIEF DESCRIPTION OF THE DRAWINGS

For a more complete understanding of the present invention and its advantages, reference is now made to the following description taken in conjunction with the accompanying drawings, wherein like reference numerals represent like parts, in which.

DETAILED DESCRIPTION OF THE INVENTION

Figure 1:
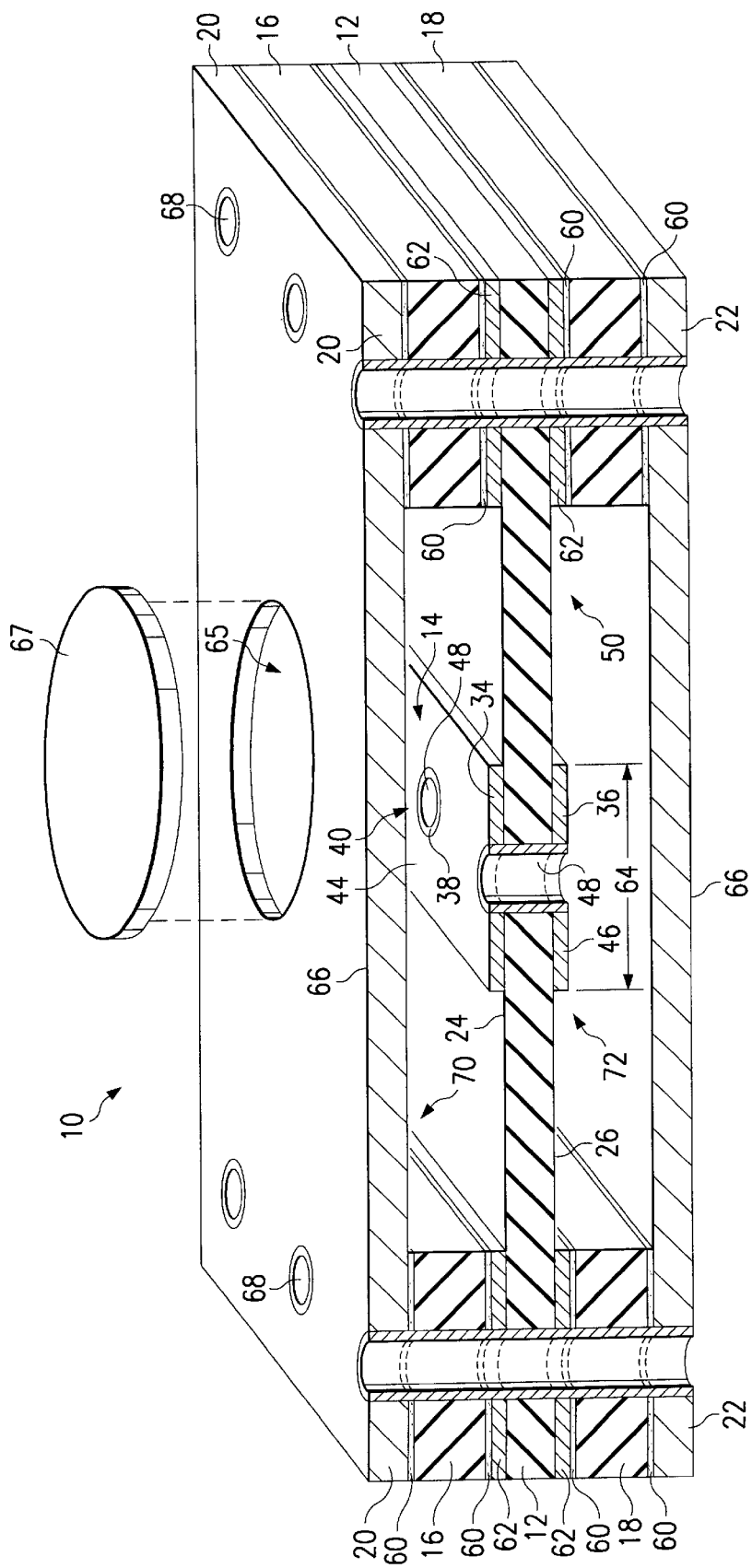
FIG. 1 is a sectional diagram illustrating a suspended transmission line in accordance with one embodiment of the present invention.

FIG. 1 illustrates a suspended transmission line 10 in accordance with one embodiment of the present invention.

In this embodiment, the suspended transmission line 10 is used to transmit microwave and other radio frequency signals in a transmission system. The transmitted signal may be an outgoing signal being transmitted to an antenna or an incoming signal being received from an antenna. As described in more detail below, an amplifier, power divider, or other active or passive device may be embedded into the transmission line 10 to manipulate a transmitted signal. It will be understood that the suspended transmission line 10 may be otherwise suitably configured for use in microwave, radio frequency and other suitable high power or other applications.

Referring to FIG. 1, the suspended transmission line 10 includes a support layer 12 supporting a center conductor 14, first and second spacers 16 and 18 each disposed on opposite sides of the support layer 12, and first and second plates 20 and 22 each disposed outwardly of a corresponding spacer 16 or 18. As described in more detail below, each of the layers 12, 16, 18, 20, and 22 may be separately fabricated and thereafter laminated together to form the suspended transmission line 10.

The support layer 12 is a thin dielectric sheet having a first side 24 and an opposite second side 26. The thickness of the support layer 12 is preferably minimized to a thickness needed to support the center conductor 14 in order to minimize the cross section of the support layer 12 and thus limit electrical fields in the layer 12. The support layer 12 may be continuous or include openings (not shown) to control propagation characteristics of the suspended transmission line 10, to allow integration of components directly into the suspended transmission line 10, and the like.

The support layer 12 is fabricated from a lossy or other inexpensive dielectric material. The use of a lossy dielectric material for the support layer 12 avoids the necessity of exotic low-loss materials such as Alumina, Duroid, cross-linked polystyrene, and Beryllium Oxide previously used to support a conductor in a suspended transmission line. Although such low-loss materials improve performance, such materials are typically very expensive. A lossy material is the material of preference because, as described in more detail below, the center conductor 14 is configured to direct an electric field generated by a signal on the center conductor 14 substantially away from the support layer 12 such that only fringing electrical fields cross the support layer 12. Dissipation losses due to the fringing electrical fields are minimal even in the lossy material of the support layer 12. As a result, the suspended transmission line 10 may be produced at relatively low cost and used in high power and high performance applications.

The lossy material of the support layer 12 is an epoxy glass such as G-10 or GFG, polyimide glass, or other suitable printed circuit board base materials such as polyester, or other suitable lossy materials. A lossy material has a moderate loss tangent of about 0.04 or less. In one embodiment, G-10 material is preferred for the support layer 12 because G-10 has good dimensional stability over a large temperature range and is easy to laminate and match to other layers and materials. In another embodiment, an incremental increase in performance is obtained by using low loss PTFE material in place of the G-10 for the support layer 12. Because the support layer 12 is thin, this results in only a small increase in cost.

The center conductor 14 is supported by the support layer 12 between the first and second plates 20 and 22. The first and second plates 20 and 22 provide the upper and lower ground planes to the suspended transmission line 10. The plates 20 and 22 may be solid metal or a base substrate material with metal layers on both sides. In one embodiment, the first and second plates 20 and 22 are solid copper to improve heat transfer. The center conductor 14 transmits a signal with low dissipation loss. Accordingly, the suspended transmission line 10 has utility to carry a signal directly between amplifiers, antennas, transmitters, receivers, and other components in the transmission or receiver system.

The center conductor 14 includes a first part 34 exposed at the first side 24 of the support layer and a second part 36 exposed at the second side 26 of the support layer 12. The first and second parts 34 and 36 of the center conductor 14 preferably mirror each other to minimize in the support layer 12 the electric field generated by a signal transmitted on the center conductor 14.

A third part 38 of the center conductor 14 connects the first and second parts 34 and 36 at intermediate points 40 along the length of the center conductor 14. Connection of the first and second parts 34 and 36 at the intermediate points 40 produces equal phase and amplitude for a signal between the first and second parts 34 and 36 and reduces electric field coupling. As a result of this structure, the electric field generated by a transmitted signal is substantially directed away from the support layer 12 with only fringing electric fields in the support layer 12. Further details of a typical electric field distribution are described below in connection with FIG. 2.

Connection of the first and second parts 34 and 36 of the center conductor 14 at the intermediate points 40 means the first and second parts 34 and 36 are electrically connected to each other at least at spaced intervals along the length of the center conductor 14. Spacing between the intermediate points 40 is substantially equal along the length of the center conductor 14 and is based on the frequency of the signal to be transmitted by the suspended transmission line 10. In a particular embodiment, the center conductor 14 includes about 10 to 20 connections per wavelength of the transmitted signal frequency. It will be understood that other suitable spacing that maintains a substantially constant phase and amplitude for a signal on the center conductor 14 may be used.

In the illustrated embodiment, the center conductor 14 is an integrated broadside conductor. For this embodiment, the first part 34 of the center conductor 14 is a first conductive strip 44 disposed on the first side 24 of the support layer and the second part 36 of the center conductor 14 is a second conductive strip 46 disposed on the second side 26 of the support layer 12. The first and second conductive strips 44 and 46 are silver-plated copper or other suitable metal traces that minimize conductor resistivity. The third part 38 of the center conductor 14 comprises a plurality of broadside connectors 48 each extending through the support layer 12 between the first and second conductive strips 44 and 46 to electrically couple the strips 44 and 46 at an intermediate point 40. Unless otherwise specified, the use of the term each herein means each of at least a subset of the identified items. The connectors 48 are copper or silver-plated copper vias or other suitable conductive connectors.

The first and second spacers 16 and 18 maintain the plates 20 and 22 in space relation with the support layer 12, and thus the center conductor 14, to form a propagation structure 50 encompassing the center conductor 14 with air and ground planes for Quasi-TEM mode of propagation. The propagation structure 50 encompasses the center conductor 14 in that it is over, including above and/or below the conductor 14 up to and not beyond the upper and lower ground plates 20 and 22. As described in more detail below, the propagation structure 50 provides a low-loss medium for propagation of the electromagnetic field generated by a transmitted signal. Accordingly, dissipation losses are minimized along the suspended transmission line 10.

The first and second spacers 16 and 18 may each be continuous along the propagation structure 50 or comprise a plurality of discrete posts or other suitable structures operable to maintain the plates 20 and 22 in space relation from the center conductor 14. The spacers 16 and 18 are sized such that substantially all of the electromagnetic field generated by a transmitted signal on the center conductor 14 is maintained in the propagation structure 50. Thus, as described in more detail below, spacer geometry is dependent on the transmitted signal frequency as well as the size, geometry, and materials of the support layer 12, center conductor 14, plates 20 and 22, and propagation structure 50.

The first and second spacers 16 and 18 are each fabricated of a dielectric, conductor, or other suitable material or materials. Preferably, the sidewalls of the spacers 16 and 18 are spaced apart and away from the center conductor 14 to minimize the effect on the electromagnetic field in the propagation structure 50. This minimizes the changes in impedance along the direction of propagation. In addition, the spacer material preferably has a coefficient of thermal expansion equal or at least similar to the material of the support layer 12 so that the suspended transmission line 10 has good mechanical stability over a large temperature range. In a particular embodiment, the support layer 12 and spacers 16 and 18 are each fabricated of G-10 material and the plates 20 and 22 are fabricated of solid copper.

For the illustrated embodiment, each spacer 16 and 18 includes adhesion layers 60 at each edge for connecting the spacers to the support layer 12 and the plates 20 and 22. The support layer 12 includes a metalization layer 62 on each side 24 and 26. The metalization layers 62 form the point of attachment of the mode suppression connection vias 68. These minimize the impedance altering effects of the potential higher order modes and reduce electromagnetic coupling between alternate board routes. In this embodiment, the first pacer 16 is attached to the metalization layer 62 on the first side 24 of the support layer 12 to separate the first plate 20 from the center conductor 14. The second spacer 18 is attached to the metalization layer 62 on the second side 26 of the support layer 12 to separate the second plate 22 from the center conductor 14. Both layers 62 on 24 and 26 are attached to the connection vias 68.

The first and second plates 20 and 22 may consist entirely of conductive metal such as copper or may consist of a lossy dielectric with copper or silver-plated copper or other suitable metal with low resistivity on each side. These plates form the ground plane 66 disposed over the center conductor 14. The ground planes 66 of the plates 20 and 22 and the underlying conductive strips 44 and 46 of the center conductor 14 together generate the electromagnetic field in the propagation structure 50. Variations in spacing of the ground plane 66 from the center conductor 14 may be offset by the line width 64 of the center conductor 14 in order to maintain a substantially constant impedance in the center conductor 14. Spacing variations may be caused by access openings 65 cut in the ground plane 66 to allow insertion and integration of a device into the suspended transmission line 10. In this case, the access opening is illustrated covered by a magnetic or other ground cover 67 secured flush with the outside of the plate 20 or 22.

In the illustrated embodiment, the plates 20 and 22 comprise a conductive material and each form a continuous ground plane 66. In a particular embodiment, the plates 20 and 22 are copper plates having a thin outer tin layer (not shown) to reduce corrosion and improve solderability. The first plate 20 is attached outwardly of the first spacer 16 to form a first propagation cavity 70 between the first plate 20 and the first conductive strip 44 of the center conductor 14. The second plate 22 is attached outwardly of the second spacer 18 to form a second propagation cavity 72 between the second plate 22 and the second conductive strip 46 of the center conductor 14. In this embodiment, the first and second propagation cavities 70 and 72 form the propagation structure 50.

The propagation cavities 70 and 72 each provide a low-loss medium for propagation of the electromagnetic field generated by a transmitted signal on the center conductor 14. The low-loss medium is a medium that propagates the electromagnetic field with a dissipation loss on the order of about 0.1 dB/inch or below at microwave frequencies. In the illustrated embodiment, the propagation cavities 70 and 72 are each an air cavity. To prevent moisture from entering the suspended transmission line 10, the propagation cavities 70 and 72 may include closed cell foam or other suitable low-loss material to displace the air and reduce overall moisture content.

A plurality of mode suppression connectors 68 are formed on either side of the propagation structure 50 to eliminate or reduce interference between the suspended transmission line 10 and nearby or adjacent transmission lines and other devices or circuits in the transmission system. The mode suppression connectors 68 are spaced in accordance with conventional techniques. In one embodiment, the mode suppression connectors 68 are tin plated copper vias extending through the support layer 12 and spacers 16 and 18 between the plates 20 and 22. The mode suppression connectors 68 are attached to the metalization layers 62 for additional mechanical support and improved mode suppression.

For the suspended transmission line 10, the geometry, size, and material of the support, spacer, and plate layers 12, 16, 18, 20 and 22 and of the center conductor 14 and propagation cavities 70 and 72 are dependent on the frequency of a signal to be transmitted by the line 10. The relationship between the transmitted signal frequency and the materials and geometry of the suspended transmission line 10 dictate that the transmission line 10 should be operated below the first cut-off frequency of the potential higher order modes. The onset of the first higher order mode may be approximated by frequency equations for rectangular waveguide and for non-integrated suspended stripline. The mode frequency equation for rectangular waveguide is as follows:

$$f_c = \frac{c0}{2 \cdot a}$$

where:

$f_c$=TE10 mode cut-off frequency c0=the speed of light in a vacuum a=the enclosure (waveguide) width The frequency equation for non-integrated suspended striplines is as follows:

$$f_c = \frac{c0}{2 \cdot a} \sqrt{1 - \frac{h}{b} \left[ \frac{e_r - 1}{e_r} \right]}$$

where:

$f_c$=1st higher order mode cut-off frequency $c0$=the speed of light in vacuum $a$=the enclosure width $b$=the enclosure height $h$=the supporting substrate height $e_r$=the relative dielectric constant of the dielectric support layer These equations provide a close estimation of values for the suspended transmission line 10, with the non-integrated suspended stripline equation generally providing a closer approximation due to the low cut-off frequency of the suspended transmission line 10. Other factors have been known to change the cut-off frequency of the suspended transmission line 10. Such factors include the size and spacing of the mode suppression connectors 68 and the size and spacing of the broadside connectors 48.

In one embodiment, values obtained for a particular implementation of the suspended transmission line 10 from the equations may be fine tuned using conventional computer simulation techniques and programs, modified to account for the configuration of the suspended transmission line 10. Suitable programs include ANSOFT EXTRACTOR for 2-D analysis and ANSOFT HFSS (High Frequency Structure Simulator) for 3-D analysis. Further modeling may be done using the BRCTL mode of the HP MDS LINECALC model. The LINECALC model is normally used for a pair of coupled lines as opposed to a single transmission line with mode voltages identical at any cross-section. In the BRCTL model, even mode characteristic impedance is used as twice the characteristic impedance of the suspended transmission line 10 to account for the dual parallel configuration of the center conductor 14. In addition, because the space between the first and second conductive strips 44 and 46 has nearly the same potential as the first and second conductive strips 44 and 46 when they are held at the same potential by the connectors 48, the first and second conductive strips 44 and 46 can be regarded as a single thick conductor. Accordingly, the thickness of the conductive strips 44 and 46 must be accounted for in impedance calculations. Other modes of the MDS LINECALC model, finite element analysis, and other suitable techniques are available to simulate and design the suspended transmission line 10.

In a particular microwave embodiment of the suspended transmission line 10, the support layer 12 comprises G-10 material having a relative dielectric constant of 4.5 and a thickness of 8 mils. In this particular embodiment, the first and second spacers 16 and 18 each comprise G-10 material and with the adhesion layers 60 having a thickness of 38 mils. The plates 20 and 22 are each copper and have a thickness of 20 mils. Each propagation cavity 70 and 72 has an enclosure width of 240 mils and an enclosure height of 38 mils. The center conductor 14 has an impedance of 50 ohms and comprises silver-plated copper traces 44 and 46 on each side 24 and 26 of the support layer and plated silver connectors 48 extending through the support layer 12 between the silver-plated traces 44 and 46. The silver-plated traces 44 and 46 each have a thickness of 1.5 mils and a line width of 20 mils. The connectors 48 have a diameter of 13 mils and are each spaced approximately 100 mils apart. The suspended transmission line 10 of this embodiment has a cut off frequency of 14.2 GHz and an upper useful range of about 14 GHz, which provides a margin to account for manufacturing tolerances. Testing of this suspended transmission line 10 showed an insertion loss of 0.02 dB per inch at 1 GHz, an insertion loss is 0.05 dB per inch at 5 GHz, an insertion loss of 0.12 dB per inch at 10 GHz, and an insertion loss of 0.55 dB per inch at 15 GHz.

Figure 2:
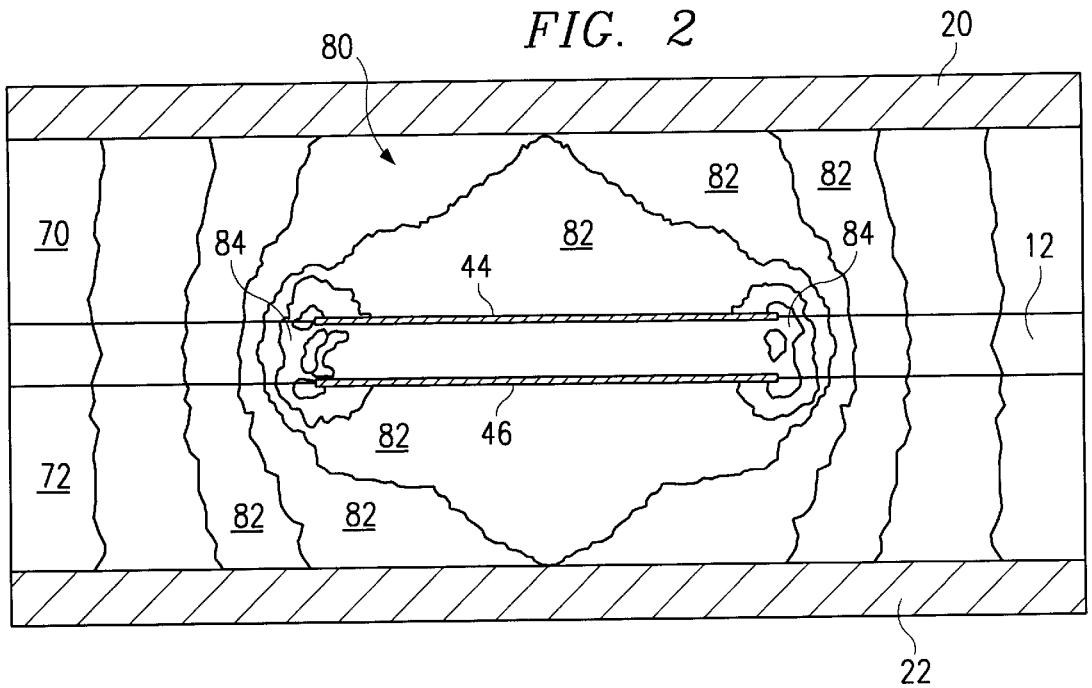
FIG. 2 is a sectional diagram illustrating distribution of an electric field in the suspended transmission line of FIG. 1.

FIG. 2 illustrates distribution of an electric field 80 in the suspended transmission line 10. As previously described, the electric field 80 is generated by a propagating electromagnetic signal around the center conductor 14. This signal may be a microwave, radio, or other suitable frequency signal.

Referring to FIG. 2, the electric field 80 includes a transverse field 82 generally perpendicular to the conductive strips 44 and 46 and small fringing fields 84 in the support layer 12 at the edges of the conductive strips 44 and 46. The transverse field 82 comprises the significant part of the electric field 80 and is propagated in the low-loss medium of the propagation cavities 70 and 72. Accordingly, dissipation or insertion losses are minimal and limited to losses in the fringing field 84.

Figure 3:
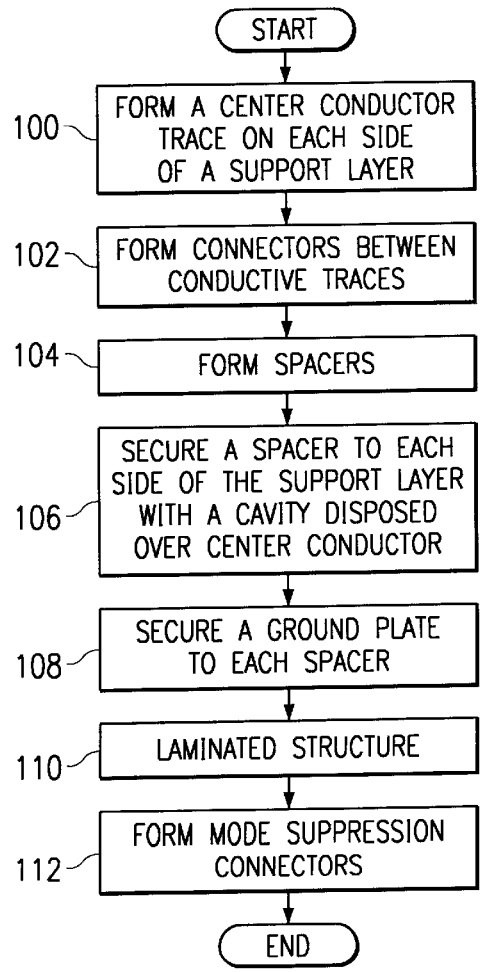
FIG. 3 is a flow diagram illustrating a method for fabricating the suspended transmission line of FIG. 1 in accordance with one embodiment of the present invention.

FIG. 3 is a flow diagram illustrating a method for fabricating the suspended transmission line 10 of FIG. 1 in accordance with one embodiment of the present invention. In this embodiment, the support, spacer, and ground layers 12, 16, 18, 20, and 22 are separately fabricated and thereafter laminated together to form the suspended transmission line 10. It will be understood that the suspended transmission line 10 may be otherwise fabricated and comprise other materials without departing from the scope of the present invention.

Referring to FIG. 3, the method begins at step 100 in which the conductive traces 44 and 46 are formed on each side 24 and 26 of the support layer 12. In one embodiment, copper on support layer 12 is patterned and etched to form the conductive traces 44 and 46. The silver is plated on the resultant copper traces. In this embodiment, the silver plating may be applied outside or at the edges of the cavities 70 and 72 to form the metalization layers 62 and provide an intermediate ground plane on each side 24 and 26 of the support layer 12. The support layer 12 is cut to size before or after formation of the conductive traces 44 and 46.

Proceeding to step 102, connectors 48 are formed in the support layer 12 between the first and second conductive strips 44 and 46. In one embodiment, the connectors 48 are formed by drilling vias at the intermediate points 40 along the conductive strips 44 and 46 and plating the vias with copper. These vias are then silver plated. As previously described, the connectors 48 provide equal phase and amplitude for a signal between the first and second conductive strips 44 and 46 to reduce electric field coupling. The reduced electric field coupling between conductive strips 44 and 46 lead to reduced insertion loss.

Next, at step 104, the first and second spacers 16 and 18 are each formed by a pair of opposing strips routed or otherwise formed from a spacer layer. The spacer layer preferably comprises an inexpensive material that is thermally matched to the support layer 12.

At step 106, the spacers 16 and 18 are each laminated to opposite sides 24 and 26 of the support layer 12. The strips for each spacer are positioned along edges of the support layer 12 and displaced from the center conductor 14 to form the propagation cavities 70 and 72. In one embodiment, the spacers 16 and 18 are laminated to the support layer 12 using a conventional no-flow or low-flow B-stage process. In the B-stage process, partially cured epoxy with glass cloth reinforcement is attached to the support layer 12 and becomes part of overlying spacer 16 or 18. The geometry of the glass cloth reinforcement matches that of the overlying spacer 16 or 18 so as to not interfere with the cavity 70 or 72. The no-flow or low-flow characteristics of the partially cured epoxy prevents or minimizes epoxy flow into the cavities 70 or 72.

Proceeding to step 108, the ground plates 20 and 22 are each formed and attached to a spacer 16 or 18. In one embodiment, each ground plate 20 and 22 is laminated to the respective spacer 16 or 18 using the no-flow or low-flow B-stage process previously described in connection with step 106. The plates 20 and 22, in connection with the spacers 16 and 18 and the support layer 12, form the propagation cavities 70 and 72.

Next, at step 110, the laminated layers are pressed together and heated to cure the epoxy and form the basic structure of the suspended transmission line 10. For the low-flow B-stage process, the layers may be pressed together at a pressure of 250–300 psi and heated at a temperature of 350 degrees Fahrenheit for 90 minutes.

At step 112, the mode suppression connectors 68 are formed for the suspended transmission line 10. In one embodiment, the mode suppression connectors 68 are each formed by drilling a via through the plates 20 and 22, spacers 16 and 18, and support layer 12, and plating the vias with copper. In this embodiment, the vias preferably have a diameter greater than 0.04 inches to allow copper and tin plating through the entirety of the vias. In this way, the suspended transmission line 10 is efficiently fabricated further reducing transmission line cost. In addition, conventional multi-layer printed circuit board fabrication techniques may be used in fabrication of the suspended transmission line 10 eliminating the need for the development and testing of new techniques and equipment.

Figure 4:
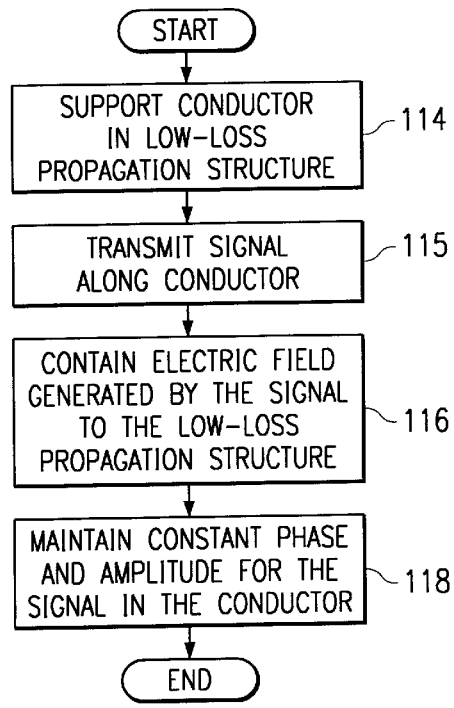
FIG. 4 is a flow diagram illustrating a method for transmitting a signal in the transmission line of FIG. 1 in accordance with one embodiment of the present invention.

FIG. 4 illustrates a method for transmitting a signal in the suspended transmission line 10. The method begins at step 114 in which the conductor 114 is supported in the low-loss propagation structure 50. As previously described, the low-loss propagation structure includes air cavities 70 and 72 formed above and below the conductor 14.

Proceeding to Step 115, a signal is transmitted along the conductor 14. At step 116, an electric field generated by the signal is substantially contained to the low-loss propagation structure 50. In addition, at step 118, a substantially constant phase and amplitude for the signal is maintained in the conductor 14. Accordingly, line losses are minimized in the suspended transmission line 10.

In accordance with another aspect of the present invention, a power amplifier or other suitable circuit is embedded into the suspended transmission line 10. Generally described, the center conductor 14 is configured to accommodate the circuit which is disposed within the propagation structure 50 and coupled to the center conductor 14 to manipulate the transmitted signal. The circuit may manipulate the transmitted signal by dividing or splitting, amplifying, or otherwise altering or modifying the signal. The resulting transmission line structure is self-contained and includes fewer parts than conventional amplifier structures. In addition, the cost of designing, engineering, constructing, and maintaining a separate mechanical housing for the amplifier is substantially eliminated.

Figure 5:
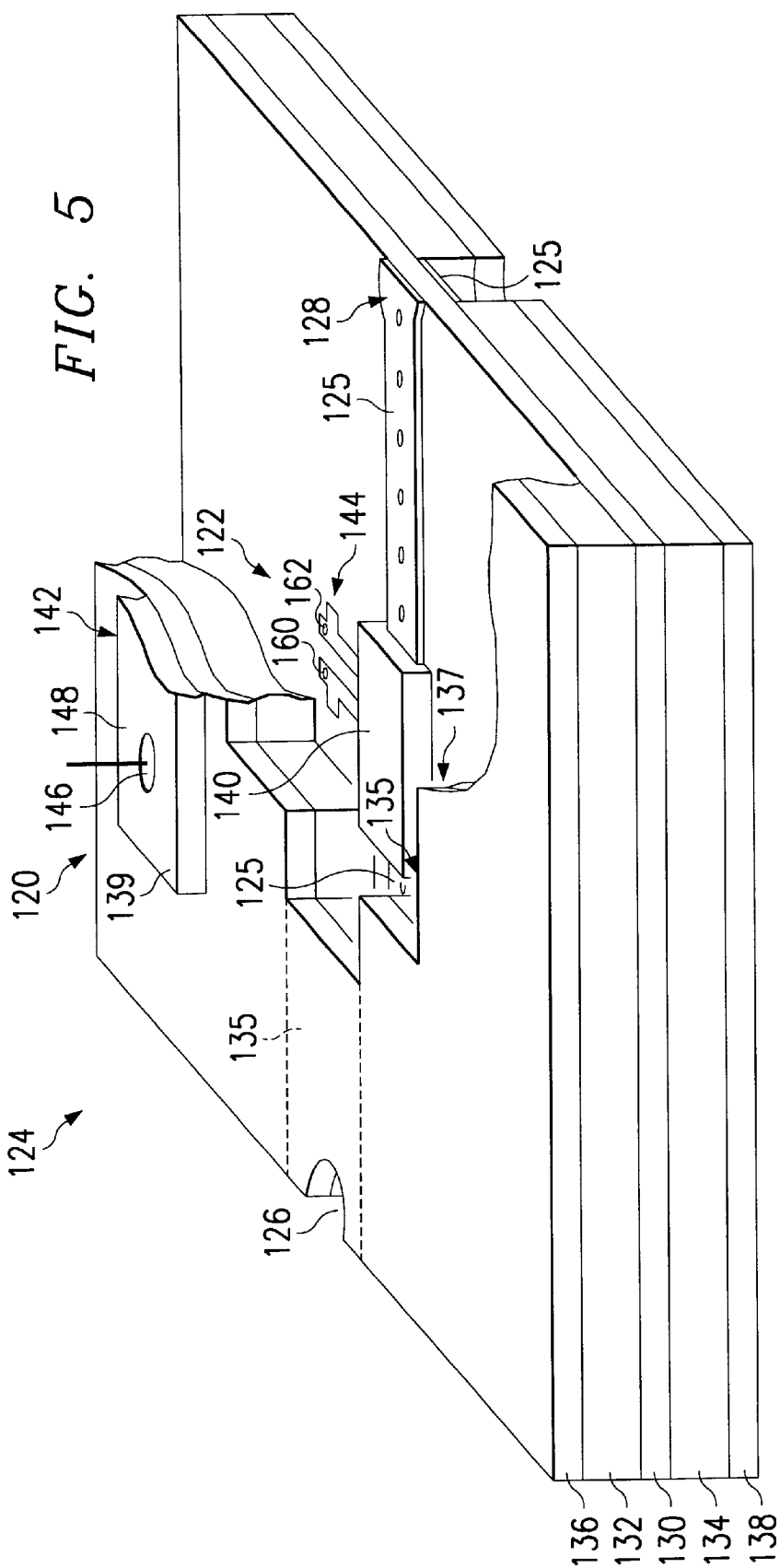
FIG. 5 is a perspective diagram illustrating a power amplifier embedded into a suspended transmission line in accordance with one embodiment of the present invention.

FIG. 5 illustrates a suspended transmission line segment 120 having an embedded amplifier 122 in accordance with one embodiment of the present invention. In this embodiment, the suspended transmission line segment 120 and embedded amplifier 122 form a power amplifier structure 124 with radio frequency (RF) input and output ports 126 and 128 that allow connection into existing transmission systems. In one embodiment, connectors allow integration with coaxial cables. Use of the amplifier structure 124 substantially minimizes the design, engineering, construction, and maintenance cost associated with a separate mechanical housing for the amplifier 122. Further use of the suspended transmission line structure as the transmission line eliminates the need for the RF connectors and further reduces cost while improving performance by minimizing line losses associated with the RF connectors.

Referring to FIG. 5, the transmission line segment 120 includes a support layer 130, first and second spacers 132 and 134, and first and second plates 136 and 138. In one embodiment, the support, spacer, and plate layers 130, 132, 134, 136, and 138 are fabricated from materials and configured as previously described in connection with corresponding layers of the suspended transmission line 10. The various parts of the transmission line segment 120 are laminated together and form a low-loss propagation structure 135 enclosing a conductor 125 supported by the support layer 130. Mode suppression connectors are formed as also described in connection with the suspended transmission line 10.

Access openings 137 are formed in the layers 130, 132, 134, 136, and 138 to accommodate the embedded amplifier 122. The access openings 137 are covered by covers 139 secured to the outside of the plates 136 and/or 138.

The conductor 125 for the suspended transmission line segment 120 is an integrated broadside conductor as described in connection with the conductor 14 of the suspended transmission line 10. The conductor 125 accordingly includes a first conductive trace formed on a first side of the support layer 130, a second conductive trace formed on a second side of the support layer 130, and a plurality of connectors that connect the first and second conductive traces at intermediate points along the length of the conductor 125. As described in more detail below, the conductor 125 is configured to receive the amplifier 122 and extends to the RF ports 126 and 128 at the inlet and the outlet of the power amplifier structure 124.

The embedded amplifier 122 includes an active device such as a transistor 140, a power feed structure 142, and a bias system 144. In one embodiment, the active device is a MESFET power transistor. As described in more detail below, the bias system 144 is coupled between the power feed structure 142 and the transistor 140 to de-couple power supply voltage from the transmitted signal on the conductor 125. Accordingly, the transistor bias system 144 also referred to as power supply has substantially no adverse effect on the radio frequency characteristics of the transmitted signal.

The transistor 140 is coupled to the conductor 125 and generates an output signal by amplifying an input signal. The transistor 140 is fitted into the suspended transmission line segment 120 through an access opening 137 in the first plate 136 and is disposed on the support layer 130. The transistor 140 is secured to the underlying second plate 138 to minimize stress on the support layer 130 and to provide good heat dissipation, thereby minimizing thermal impedance in the conductor 125. In one embodiment, the first plate 136 and the second plate 138 are fabricated from copper which has improved heat dissipation properties. The transistor 140 may be otherwise suitably disposed and secured within the power amplifier structure 124.

The transistor 140 is a metal semiconductor field effect transistor (MESFET) or other suitable transistor capable of amplifying an input signal. The transistor 140 may be internally matched to provide a substantially constant line impedance at its input and output. Alternatively, the conductor 125 can be configured to support a partially matched or a non-matched transistor 140.

The power feed structure 142 is connected to a power supply (not shown) and provides power to the transistor 140 to amplify the transmitted signal. The power supply is a conventional direct current battery or other suitable power source capable of operating the transistor 140.

The power feed structure 142 includes voltage nodes 160 and 162 formed on the support layer 130 and feed pins 146 extending through the first plate 136 to the voltage nodes. As described in more detail below, the voltage nodes are coupled to the transistor 140 through the bias structure 144. The feed pins 146 connect the voltage nodes 160 and 162 to the power supply and are insulated from the first plate 136 by an insulative cover 148 or insulative portions of the cover 148. In one embodiment, the feed pins 146 consists of two separate pins and are electrically conducted through separate wires that are soldered from the feed pins 146 directly to the voltage nodes 160 and 162. The two feed pins 146 each provide separate voltages to voltage nodes 160 and 162. The voltage node 160 carries the necessary gate voltage to the MESFET. The voltage node 162 conducts the necessary drain voltage to the MESFET.

Figure 6:
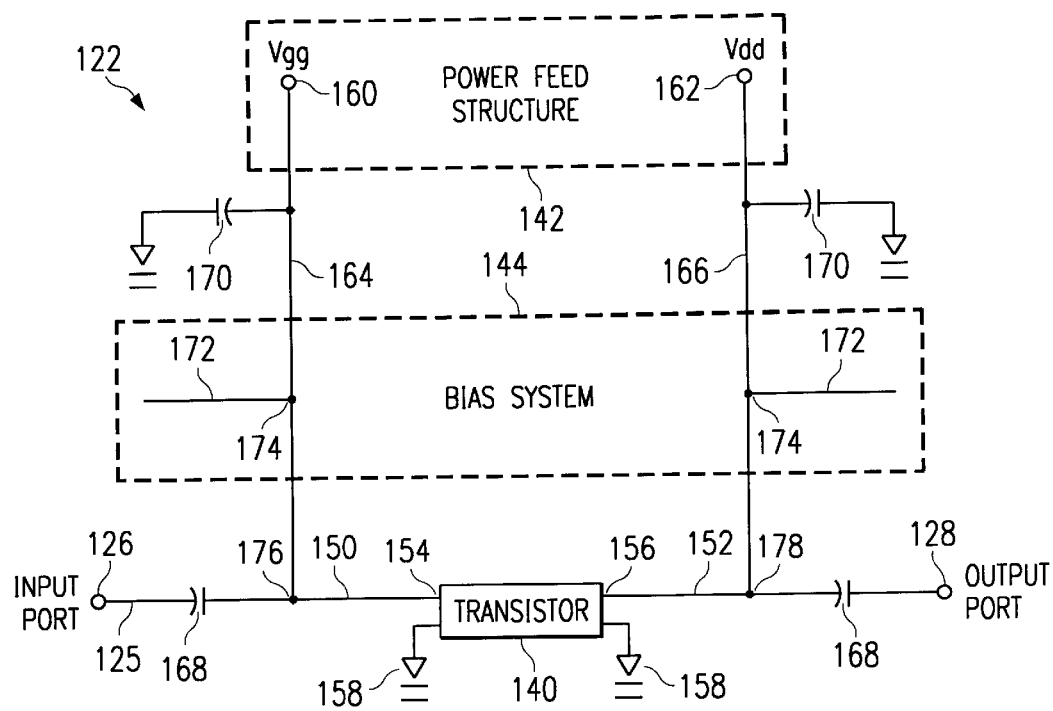
FIG. 6 is a schematic diagram illustrating the configuration of the center connector for the embedded power amplifier of FIG. 5 in accordance with one embodiment of the present invention.

FIG. 6 schematically illustrates the embedded amplifier 122. Referring to FIG. 6, the conductor 125 includes an amplifier input section 150 coupled to the input port 126 and an amplifier output section 152 coupled to the output port 128. The transistor 140 is connected between the amplifier input and output sections 150 and 152 to amplify and transmit the input signal from input port 126 to output port 128. For the MESFET embodiment, a transistor gate 154 is connected to the amplifier input section 150 and a transistor drain 156 is connected to the amplifier output section 152. A transistor source 158 is grounded to an intermediate ground plane formed with the conductor 125. This ground plane is referenced as plate 22 of FIG. 1.

The power feed structure 142 includes a gate voltage node 160 and a drain voltage node 162. Power is supplied at each node 160 and 162 by the feed pins 146 (FIG. 4). The gate voltage node 160 is connected to the transistor gate 154 via a gate power feed line 164 and the amplifier input section 150. The drain voltage node 162 is connected to the transistor drain 156 via a drain power feed line 166 and the amplifier output section 152. Accordingly, the conductor 125 is used for both signal and bias power transmission to the transistor. RF blocking capacitors 168 are provided in the conductor 125 on each side of the gate and drain power feed lines 164 and 166 to de-couple power from signal transmission and thereby prevent bias power shorting in the conductor 125 to non-open load impedances. Blocking capacitors 170 also connect each power feed line 164 and 166 to ground in order to de-couple power and signal transmission in the feed line and thereby prevent leakage of the signal frequency from conductor 125 back into the power feed structure 142. The blocking capacitors 168 and 170 are single or multi-layer ceramic or other suitable capacitor dielectric material.

The bias system 144 includes a quarter wavelength line 172 extending from each power feed line 164 and 166. The quarter wavelength lines 172 each generate a radio frequency short at a junction 174 with the corresponding power feed line 164 or 166. The radio frequency short further de-couples the voltage nodes 160 and 162 from the conductor 125 to prevent interference with the transmitted signal. It will be understood that the conductor 125, transistor 140, power feed structure 142, and bias system 144 may be otherwise suitably configured or implemented to amplify the transmitted signal and prevent or minimize amplifier operation from interfering with signal transmission on the conductor 125.

In a particular embodiment, the power amplifier 122 is a four-watt power amplifier for a 10 GHz transmitted signal. In this embodiment, the transistor 140 is a FUJITSU four-watt FLM0910-4C internally matched MESFET. The conductor 125 has a substantially constant line width of 76 mils. On the gate side of the transistor 140, the conductor 125 has a length of 400 mils from the input port 126 to the blocking capacitor 168, a length of 65 mils from the blocking capacitor 168 to a junction 176 with the gate voltage feed line 164, and a length of 65 mils from the junction 176 to the transistor 140. On the drain side of the transistor 140, the conductor 125 has a length of 65 mils from the transistor 140 to a junction 178 with the drain voltage feed 166, a length of 65 mils from the junction 178 to the blocking capacitor 168, and a length of 400 mils from the blocking capacitor 168 to the output port 128. The propagation structure 135 comprises a first air cavity above the conductor 125 and a second air cavity below the conductor 125. Each air cavity has a width of 240 mils and a height of 87 mils. The gate and drain voltage feed lines 164 and 166 each have a line width of 25 mils and a length of 235 mils from the corresponding junction 176 or 178 with the conductor 125 to the quarter wavelength line 172 and a length of 140 mils from the quarter wavelength line 172 to the corresponding voltage node 160 or 162. The quarter wavelength lines 172 each have a line width of 80 mils and a length of 268 mils. The blocking capacitors 168 are each 10 pF capacitors. The blocking capacitors 170 are each 100 pF capacitors. The resulting power amplifier may be connected in series with other similar power amplifies to form a two stage power amplifier. In the two stage configuration, the amplifiers have a combined output power of 35.2 dBm with an 11.0 dBm input level, a combined output power of 36 dBm with a 12.5 dBm input level, and a combined output power of 36 dBm at an input level of 14 dBm. Corresponding efficiencies for the capacitor stages are 23.89 percent, 27.5 percent, and 23.3 percent.

FIGS. 7A–F illustrate the configuration of the support, spacer, and plate layers 130, 132, 134, 136, and 138 for the 10 GHz, four-watt power amplifier embodiment. In this embodiment, the power amplifier structure 124 has dimensions of 2.75 inches by 2 inches with the ground planes formed on the support layer 130 and by first and second plates 136 and 138 extending 0.025 inches beyond the edges of the remaining layers. The power amplifier structure 124 may be otherwise suitably configured or formed in a segment of a suspended transmission line or in an extended run of a suspended transmission line.

Figure 7A:
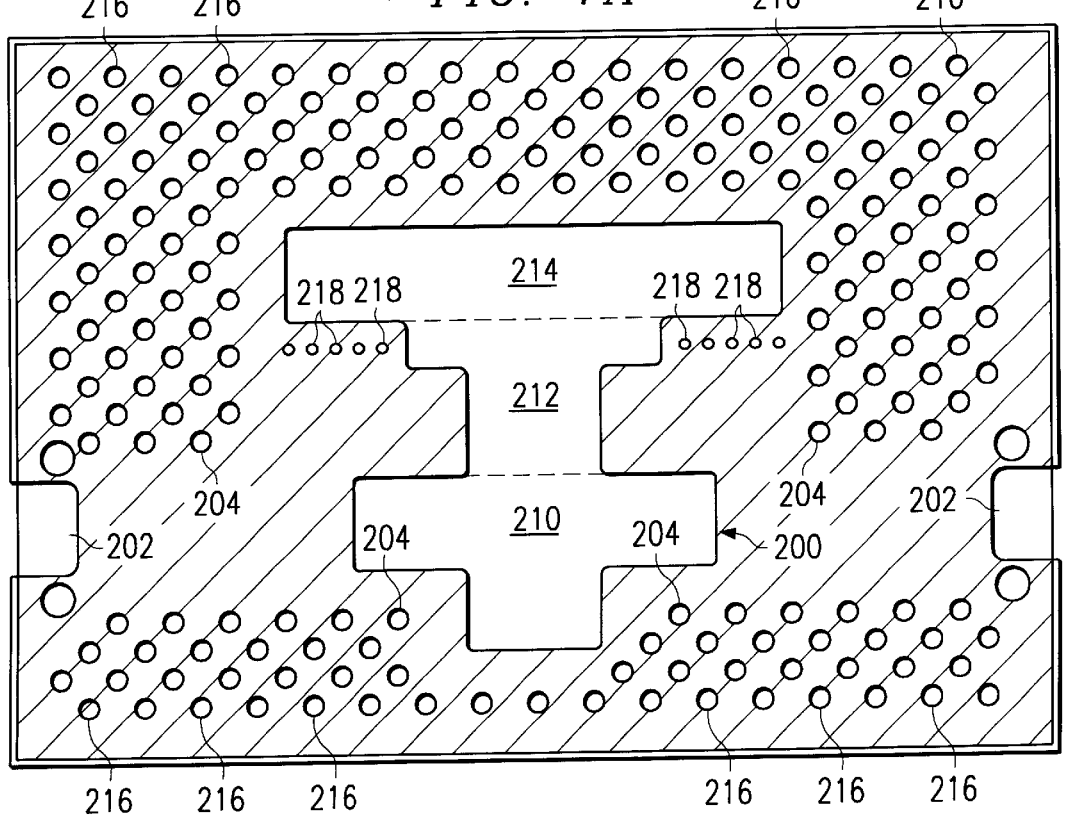
FIGS. 7A–F are top plan diagrams illustrating the configuration of each layer for the embedded power amplifier of FIG. 5 in accordance with one embodiment of the present invention.

Referring to FIG. 7A, the first plate 136 includes an access opening 200, radio frequency connector openings 202, and mode suppression vias 204. The mode suppression vias 204 also reduce overall weight in this embodiment. The first plate 136 is a tin-plated copper plate. The access opening 200 is configured to allow insertion of the amplifier and related circuitry into the suspended transmission line segment 120 (also refer to FIG. 5). A first portion 210 of the access opening 200 allows insertion of the transistor 140. A second portion 212 of the access opening 200 allows implementation of the bias system 244 while a third portion 214 allows implementation of the power feed structure 142.

The mode suppression vias 204 are formed and plated as previously described in connection with mode suppression connectors 68 (FIG. 1) and comprise a first set of vias 216 each having a diameter of 0.55 inches, in one embodiment, on either side of the propagation structure 135. A second set of mode suppression vias 218 are formed between the propagation structure 132 and the power feed structure 242 and have a diameter of 0.30 inches in the same embodiment.

Figure 7B:
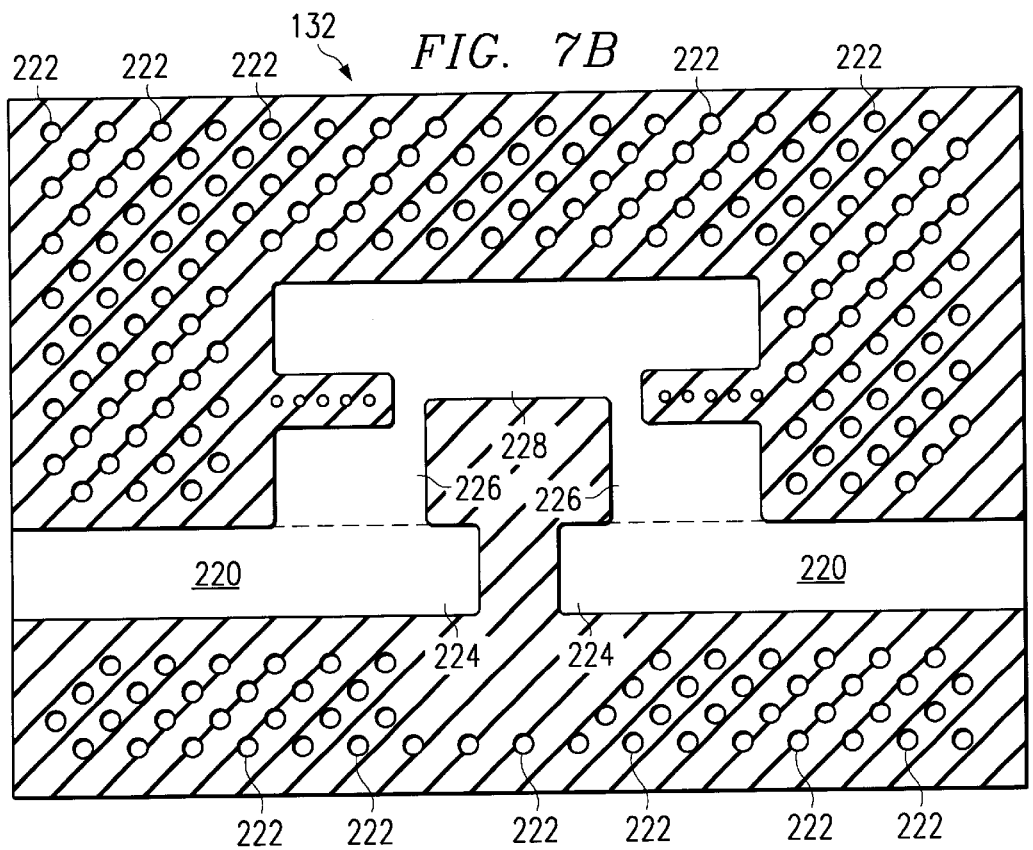

Referring to FIG. 7B, the first spacer layer 132 is formed of G-10 material, in one embodiment, and includes a pathway 220 and mode suppression vias 222. The pathway 220 includes a first part 224 that is part of a first air cavity of the propagation structure 135, a second part 226 to allow implementation of the bias system 144, and a third part 228 to allow implementation of the power feed structure 242. Air cavities formed by the second and third parts 226 and 228 of the pathway 220 are electrically isolated from the propagation structure 135. The mode suppression vias 222 are spaced, sized, and formed as previously described in connection with mode suppression vias 204.

Figure 7C:
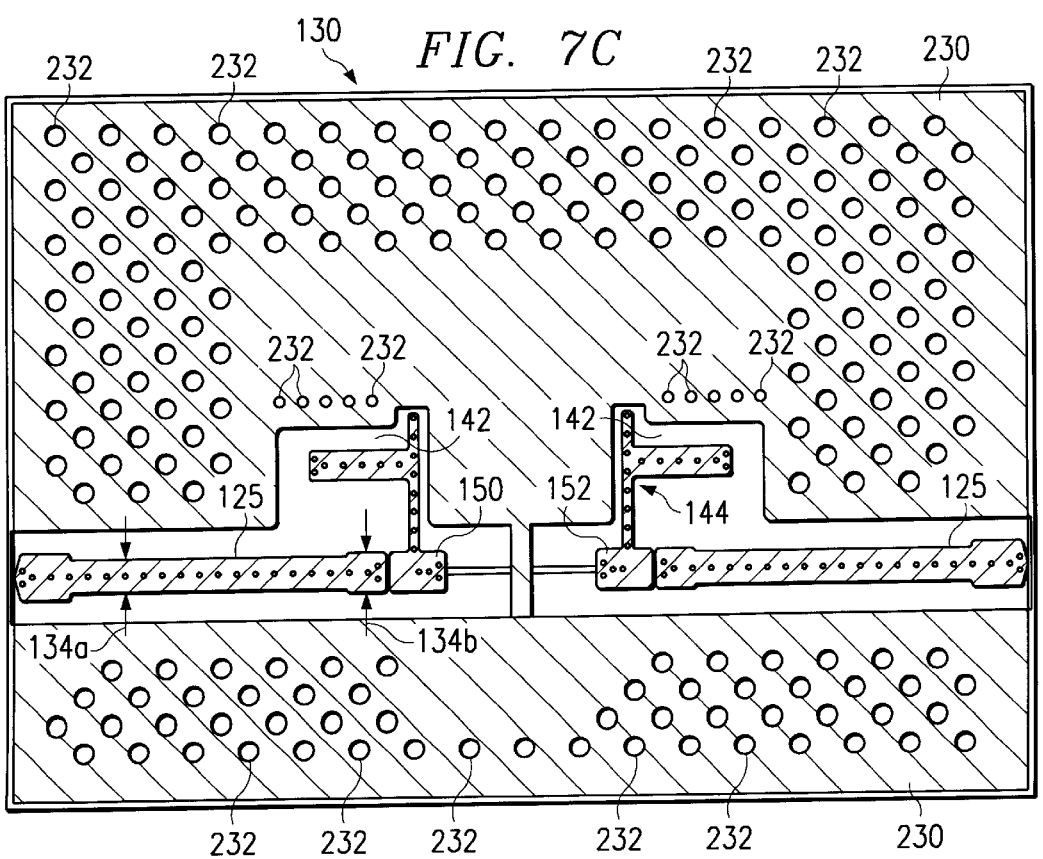

Referring to FIG. 7C, the support layer 130 is formed of G-10 material, in one embodiment, and includes intermediate ground planes 230, conductor 125, bias system 144, power feed structure 142, and mode suppression vias 232. The intermediate ground planes 230, conductor 125, bias system 144, and power feed structure 142 are formed by a single metalization layer on each side of the support layer 130. Each metalization layer is formed by depositing, patterning, and etching copper and adding silver plate. Preferably, the metalization is mirrored on each side of the support layer 130. The conductor 125 includes amplifier input section 150 and amplifier output section 152.

As shown by FIG. 7C, the conductor 125 includes disparate line widths 134a and 134b to account for varying heights of the overlying propagation structure 135. Variance of the conductor 125 line width 134 based on the overhead height of the propagation structure 135 maintains a substantially constant impedance in the conductor 125. The mode suppression vias 232 are spaced, sized, and formed as previously described in connection with mode suppression vias 204.

Figure 7D:
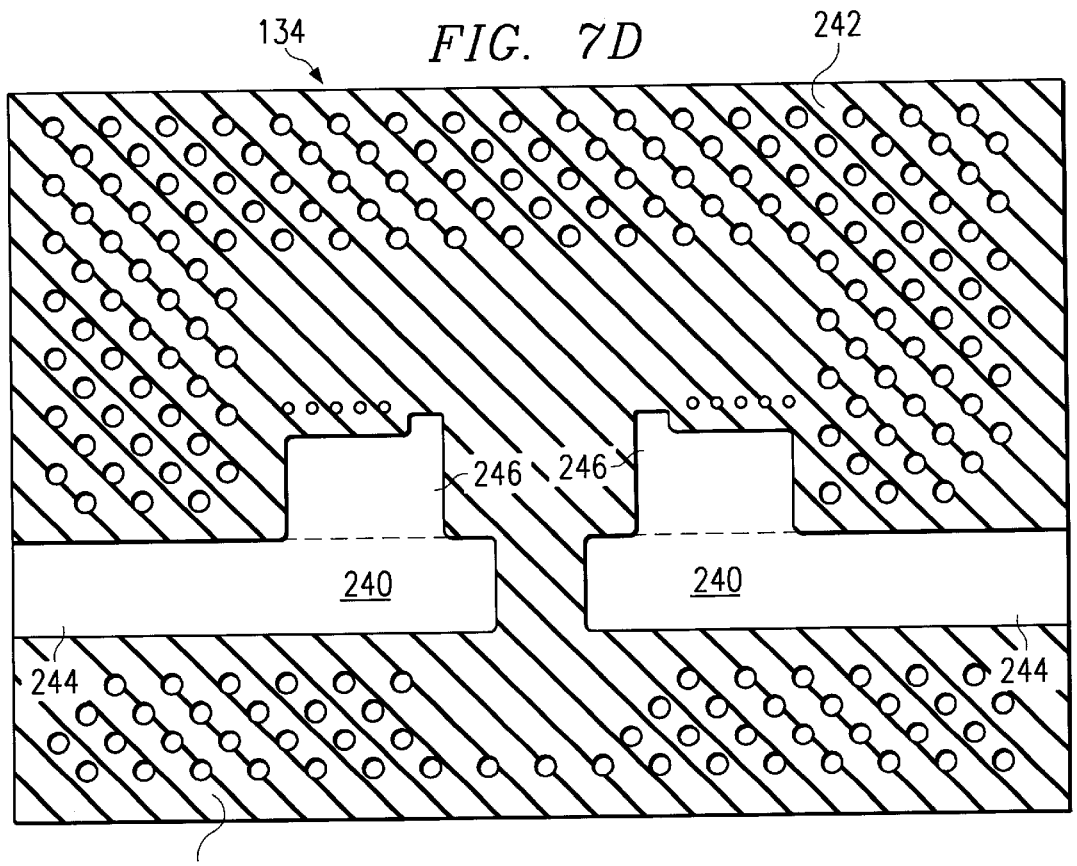

Referring to FIG. 7D, the second spacer layer 134 is formed of G-10 material and comprises a pathway 240 and mode suppression vias 242. The pathway 240 includes a first section 244 is part of a second air cavity of the propagation structure 135 and a second section 246 to allow implementation of the bias system 244. The pathway 240 does not include a section for implementation of the power feed structure 142 as it need only be implemented on one side of the support layer 130.

Figure 7E:
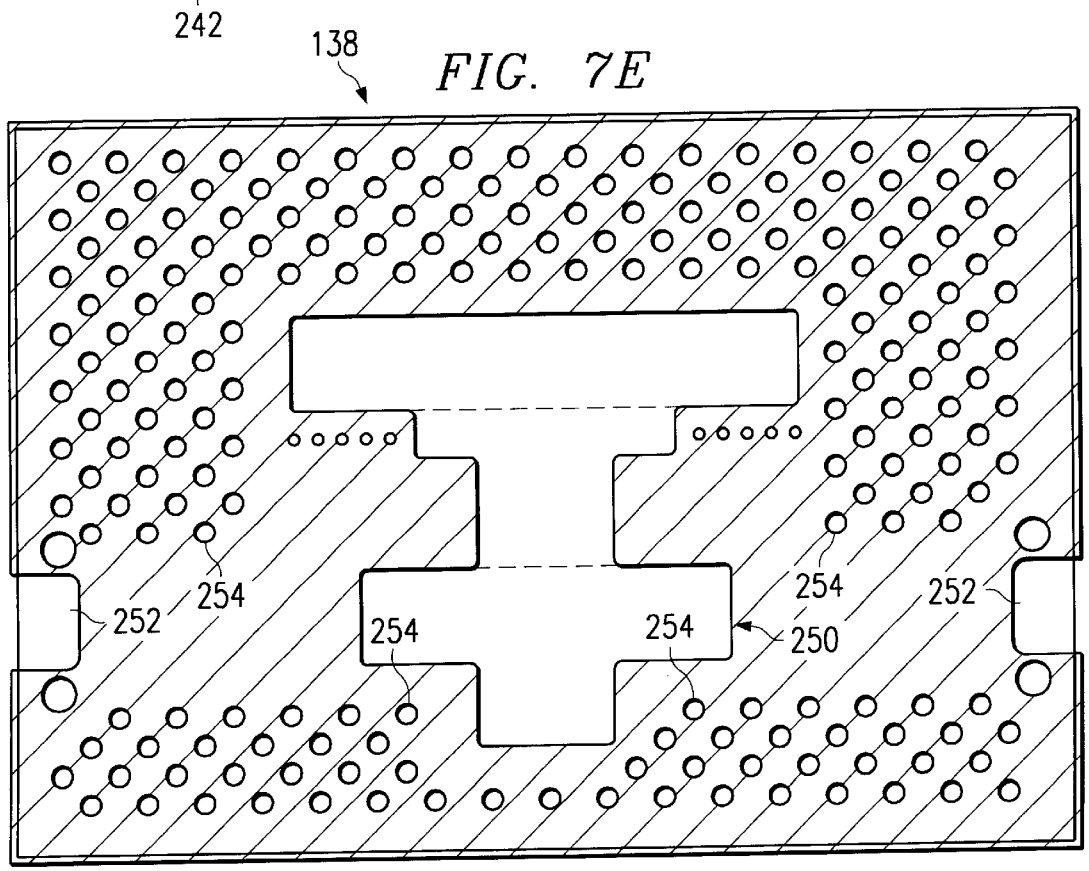

Referring to FIG. 7E, the second plate 138 is formed from tin-plated copper and includes an access opening 250, radio frequency connector openings 252, and mode suppression vias 254. The access opening 250 is configured to secure the transistor 140 to the second plate 138. As previously described, this minimizes stress on the support layer 130 and provides good heat dissipation characteristics for the transistor 140 during operation of the power amplifier structure 124. The radio frequency connector openings 252 and mode suppression vias 254 are configured and formed as previously described in connection with corresponding structures of the first plate 136. After formation of each layer 130, 132, 134, 136, and 138, the layers are laminated together to form the suspended transmission line segment 120 (refer to FIG. 5).

Figure 7F:
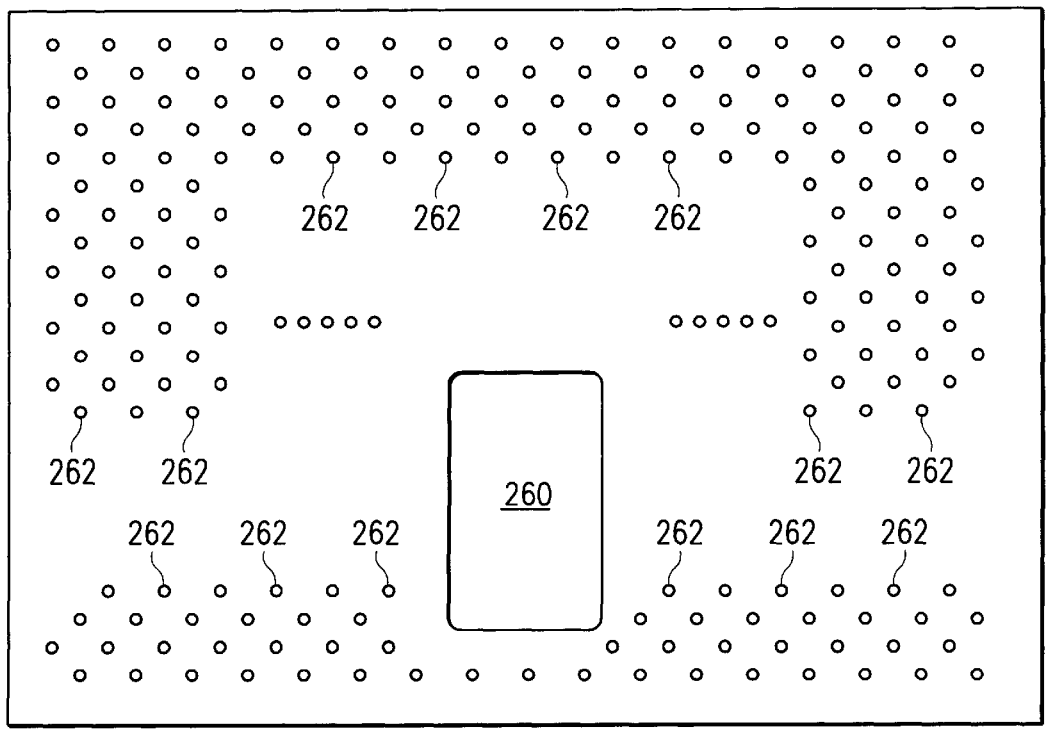

Referring to FIG. 7F, after formation of the suspended transmission line segment 120, the mode suppression vias 204, 222, 232, 242, and 254 are drilled and plated to form mode suppression connectors. A through opening 260 is formed in each of the layers 130, 132, 134, and 136. The transistor 140, feed pins 146, and capacitors 168 and 170 are embedded into the transmission line segment 120 by inserting the devices through the openings and soldering or otherwise securing the devices to the conductor 125, power feed structure 142, and bias system 144. Covers 139 are soldered or otherwise secured over the openings. Accordingly, the transmission line structure is self-contained and ultimately lower cost than standard industry implementations.

Figure 8:
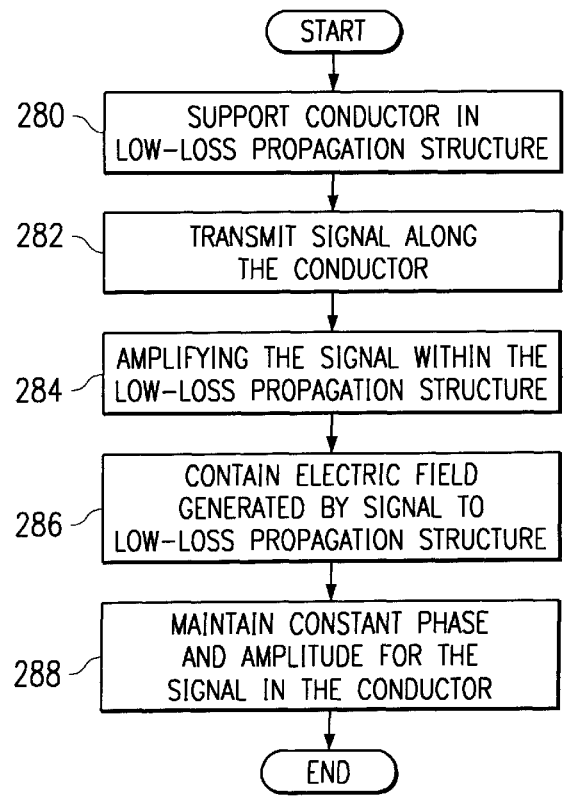
FIG. 8 is a flow diagram illustrating a method for amplifying a signal in a suspended transmission line in accordance with one embodiment of the present invention.

FIG. 8 illustrates a method for amplifying a signal in the power amplifier structure 124. The method begins at step 280 to support the conductor 125 in the low-loss propagation structure 135 of the suspended transmission line segment 120. Next, at step 282, a signal is transmitted along the conductor 125.

Proceeding to step 284, the signal is amplified within the low-loss propagation structure 135. As previously described, the signal is amplified by the transistor 140 which is connected to amplifier input and output sections 150 and 152 of the conductor 125.

Next, at step 286, an electric field generated by the signal is substantially contained to the low-loss propagation structure 135. In addition, at step 286, a substantially constant phase and amplitude for the signal is maintained in the conductor 125. Accordingly, line losses are minimized in the suspended line segment 120. Step 286 leads to the end of the process by which the signal is amplified in a low cost suspended transmission line with low line loss.

Although the present invention has been described with several embodiments, various changes and modifications may be suggested to one skilled in the art. It is intended that the present invention encompass such changes and modifications as fall within the scope of the appended claims.

What is claimed is:

1. A suspended transmission line with an embedded amplifier, comprising:

a support layer;

a conductor supported on the support layer between first and second plates each plate having a ground plane, the conductor comprises a first conductive strip supported on a first side of the support layer, a second conductive strip supported on a second side of the support layer, an amplifier input section and an amplifier output section;

a propagation structure between the first and second plates to substantially contain an electric field generated by a signal transmitted on the conductor; and an amplifier coupled to the amplifier input and output sections of the conductor and at least substantially disposed between the first and second plates, the amplifier operable to amplify an input signal received on the amplifier input section to generate an output signal for transmission on the amplifier output section.

2. The suspended transmission line of claim 1, wherein the amplifier comprises:

a transistor coupled between the amplifier input and output sections of the conductor and disposed within the propagation structure; and a power feed structure operable to supply power to the transistor, the power feed structure coupled to the amplifier input and output sections of the conductor.

3. The suspended transmission line of claim 2, further comprising a bias system coupling the power feed structure to the amplifier input and output sections of the conductor.

4. The suspended transmission line of claim 3, the bias system comprising:

a first power lead connecting the power feed structure to the amplifier input section of the conductor;

a first quarter wavelength line extending from the first power lead and operable to form a radio frequency short in the first power lead;

a second power lead connecting the power feed structure to the amplifier output section of the conductor; and a second quarter wavelength line extending from the second power lead and operable to form a radio frequency short in the second power lead.

5. The suspended transmission line of claim 1, further comprising the propagation structure at least substantially enclosing the amplifier.

6. The suspended transmission line of claim 1, further comprising the propagation structure entirely enclosing the amplifier.

7. The suspended transmission line of claim 1, wherein the support layer comprises a lossy material.

8. The suspended transmission line of claim 7, wherein the lossy support layer comprises an epoxy glass material.

9. The suspended transmission line of claim 1, wherein the first and second conductive strips substantially mirror each other.

10. The suspended transmission line of claim 1, wherein the conductor further comprises a plurality of connectors extending between the first and second conductive strips at intermediate points along the length of the conductor.

11. The suspended transmission line of claim 10, wherein the connectors are substantially evenly spaced along the length of the conductor.

12. The suspended transmission line of claim 1, wherein the support layer, conductor, and propagation structure have a configuration and size to transmit a radio frequency signal.

13. The suspended transmission line of claim 1, wherein the propagation structure comprises a first air cavity between the conductor and the first plate and a second air cavity between the conductor and the second plate.

14. The suspended transmission line of claim 13, further comprising:

a first spacer between the support layer and the first plate to form the first air cavity over the conductor; and a second spacer between the support layer and the second plate to form the second air cavity over the conductor.

15. The suspended transmission line of claim 14, further comprising a plurality of mode suppression connectors connecting the first and second plates at spaced intervals.

16. A suspended transmission line with an embedded amplifier, comprising:

a support layer;

a conductor supported on the support layer between first and second plates each plate having a ground plane, the conductor including an amplifier input section and an amplifier output section;

a propagation structure between the first and second plates to substantially contain an electric field generated by a signal transmitted on the conductor, the propagation structure comprising a first air cavity between the conductor and the first plate and a second air cavity between the conductor and the second plate;

a first spacer between the support layer and the first plate to form the first air cavity over the conductor;

a second spacer between the support layer and the second plate to form the second air cavity over the conductor;

a plurality of mode suppression connectors between the first and second plates at spaced intervals; and an amplifier coupled to the amplifier input and output sections of the conductor and at least substantially disposed between the first and second plates, the amplifier operable to amplify an input signal received on the amplifier input section to generate an output signal for transmission on the amplifier output section.

17. The suspended transmission line of claim 16, further comprising:

the first cavity having disparity in height over the conductor; and the conductor comprising disparity in line width to maintain a substantially constant impedance in the conductor.

18. A suspended transmission line with an embedded circuit, comprising:

a support layer;

a conductor supported on the support layer between first and second plates each plate having a ground plane, the conductor comprises a first conductive strip supported on a first side of the support layer, a second conductive strip supported on a second side of the support layer, a circuit input section and a circuit output section;

a propagation structure between the first and second plates to substantially contain an electric field generated by a signal transmitted on the conductor;

an active circuit coupled to the circuit input and output sections of the conductor and at least substantially disposed between the first and second plates, the circuit operable to manipulate an input signal received on the circuit input section to generate an output signal for transmission on the circuit output section; and a power feed structure operable to supply power to the circuit, the power feed structure coupled to the circuit input and output sections of the conductor.

19. The suspended transmission line of claim 18, wherein the propagation structure at least substantially encloses the circuit.

20. The suspended transmission line of claim 18, wherein the propagation structure entirely encloses the circuit.

21. A method for transmitting a radio frequency signal in a transmission line, comprising:

supporting a first conductive strip on a first side of a support layer in a low-loss propagation structure between opposing ground planes;

supporting a second conductive strip on a second side of the support layer;

connecting the first and second conductive strips at spaced intervals along the length of the conductors to maintain a substantially constant phase and amplitude for the radio frequency signal;

transmitting the signal along the first and second conductive strips;

amplifying within the low-loss propagation structure the signal as transmitted on the first and second conductive strips; and containing an electric field generated by the signal substantially to the low-loss propagation structure.

22. The method of claim 21, further comprising supporting the first and second conductive strips on a lossy support layer.

23. The method of claim 21, further comprising:

supplying power on the conductor to amplify the signal; and de-coupling the power from the radio frequency performance of the conductor.

24. A suspended transmission line with an embedded circuit, comprising:
- a lossy material support layer;
- a conductor supported on the support layer between first and second plates each plate having a ground plane, the conductor comprises a first conductive strip supported on a first side of the support layer, a second conductive strip supported on a second side of the support layer, a circuit input section and a circuit output section;
- a propagation structure between the first and second plates to substantially contain an electric field generated by a signal transmitted on the conductor; and
- a circuit coupled to the circuit input and output sections of the conductor and at least substantially disposed between the first and second plates, the circuit operable to manipulate an input signal received on the circuit input section to generate an output signal for transmission on the circuit output section.

25. The suspended transmission line of claim 24, wherein the conductor further comprises a plurality of connectors extending between the first and second conductive strips at intermediate points along the length of the conductor.

26. A suspended transmission line with an embedded circuit, comprising:
- a support layer;
- a conductor supported on the support layer between first and second plates each plate having a ground plane, the conductor comprising a first conductive strip supported on a first side of the support layer and a second conductive strip supported on a second side of the support layer, the conductor including a circuit input section and a circuit output section;
- a propagation structure between the first and second plates to substantially contain an electric field generated by a signal transmitted on the conductor; and
- a circuit coupled to the circuit input and output sections of the conductor and at least substantially disposed between the first and second plates, the circuit operable to manipulate an input signal received on the circuit input section to generate an output signal for transmission on the circuit output section.

27. The suspended transmission line of claim 26, wherein the conductor further comprises a plurality of connectors extending between the first and second conductive strips at intermediate points along the length of the conductor.

28. A suspended transmission line with an embedded amplifier, comprising:
- a support layer;
- a conductor supported on the support layer between first and second plates each plate having a ground plane, the conductor including an amplifier input section and an amplifier output section;
- a propagation structure between the first and second plates to substantially contain an electric field generated by a signal transmitted on the conductor;
- an amplifier coupled to the amplifier input and output section of the conductor and at least substantially disposed between the first and second plates, the amplifier operable to amplify an input signal received on the amplifier input section to generate an output signal for transmission on the amplifier output section;
- a power feed structure operable to supply power to the amplifier, the power feed structure coupled to the amplifier input and output sections of the conductor;
- a first power lead connecting the power feed structure to the amplifier input section of the conductor;
- a first quarter wave-length line extending from the first power lead and operable to form a radio frequency short in the first power lead;
- a second power lead connecting the power feed structure to the amplifier output section of the conductor; and
- a second quarter wave-length line extending from the second power lead and operable to form a radio frequency short in the second power lead.

* * * * *

UNITED STATES PATENT AND TRADEMARK OFFICE
CERTIFICATE OF CORRECTION

PATENT NO. : 6,518,844 B1
DATED : February 11, 2003
INVENTOR(S) : James R. Sherman et al.

It is certified that error appears in the above-identified patent and that said Letters Patent is hereby corrected as shown below:

Title page,
Item [56], References Cited, FOREIGN PATENT DOCUMENTS, delete "H01P/6/08" and insert -- H01P/6/06 --.

Column 5,
Line 43, delete "pacer" and insert -- spacer --.

Column 6,
Line 64, after "c" delete "O" and insert -- 0 --.

Signed and Sealed this

Twenty-third Day of March, 2004

JON W. DUDAS
*Acting Director of the United States Patent and Trademark Office*